United States Patent [19]

Badesha

[11] Patent Number: 5,030,477
[45] Date of Patent: Jul. 9, 1991

[54] PROCESSES FOR THE PREPARATION AND PROCESSES FOR SUPPRESSING THE FRACTIONATION OF CHALCOGENIDE ALLOYS

[75] Inventor: Santokh S. Badesha, Pittsford, N.Y.

[73] Assignee: Xerox Corporation, Stamford, Conn.

[21] Appl. No.: 270,182

[22] Filed: Nov. 14, 1988

[51] Int. Cl.$^5$ .................. C23C 14/14; C23C 14/18; C23C 14/24
[52] U.S. Cl. ........................... 427/50; 427/49; 427/76; 427/123; 427/124; 427/250; 427/255.3; 423/509
[58] Field of Search ............ 427/76, 255.3, 248.1, 427/376.2, 376.4, 42, 123, 124, 49, 50, 250; 420/579; 423/508, 509, 601, 602, 617, 618; 106/286.1

[56] References Cited

U.S. PATENT DOCUMENTS

| | | | |
|---|---|---|---|
| 3,248,261 | 4/1966 | Narken et al. | 427/76 |
| 3,476,593 | 11/1969 | Lehrer | 420/579 |
| 3,607,388 | 9/1971 | Hori et al. | 427/76 |
| 3,793,069 | 2/1974 | Shimizu et al. | 427/76 |
| 3,975,306 | 8/1976 | Jones et al. | 423/508 |
| 4,013,463 | 3/1977 | Leder | 430/85 |
| 4,019,902 | 4/1977 | Leder et al. | 430/88 |
| 4,205,098 | 5/1980 | Kobayashi et al. | 427/76 |
| 4,207,119 | 6/1980 | Tyan | 427/76 |
| 4,484,945 | 11/1984 | Badesha et al. | 420/579 |
| 4,513,031 | 4/1985 | Leder | 427/250 |
| 4,540,652 | 9/1985 | Chuiko et al. | 430/84 |
| 4,554,230 | 11/1985 | Foley et al. | 430/58 |
| 4,576,634 | 3/1986 | Badesha et al. | 420/579 |
| 4,601,965 | 7/1986 | Ide et al. | 430/85 |
| 4,615,964 | 10/1986 | Oda et al. | 430/84 |
| 4,621,032 | 11/1986 | deNeufville et al. | 427/255.3 |
| 4,710,442 | 12/1987 | Koelling et al. | 430/85 |

*Primary Examiner*—Shrive Beck
*Assistant Examiner*—Margaret Burke
*Attorney, Agent, or Firm*—E. O. Palazzo

[57] ABSTRACT

A process for the preparation of a chalcogenide alloy which comprises the evaporation of a mixture of a chalcogenide alloy and a metal oxide. Also, there is disclosed a process for controlling the fractionation of chalcogenide alloys which comprises providing a mixture of chalcogenide alloy, and a metal oxide; and subsequently subjecting the resulting mixture to evaporation; and a process for controlling the fractionation of selenium alloys which comprises providing a selenium alloy; admixing therewith a metal oxide; and subsequently subjecting the resulting mixture to evaporation.

52 Claims, No Drawings

PROCESSES FOR THE PREPARATION AND PROCESSES FOR SUPPRESSING THE FRACTIONATION OF CHALCOGENIDE ALLOYS

BACKGROUND OF THE INVENTION

The present invention relates to processes for the preparation of chalcogenide alloys and to processes for suppressing the fractionation of chalcogenide alloys. More specifically, the present invention relates to processes for controlling the fractionation of chalcogenide alloys during, for example, the vacuum deposition thereof. In one embodiment, the present invention is directed to a process for controlling and suppressing the fractionation of chalcogenide alloys which comprises adding to the source material selected, such as a source alloy, metal oxides thereby enabling, for example, desirable chalcogenide alloys possessing homogeneous distributions of the chalcogens throughout the product obtained. The products resulting from the process of the present invention can be selected as photoconductors or photoreceptors in electrophotographic imaging systems, including xerographic imaging and printing methods.

Chalcogens and chalcogenide alloys, and their use in electrophotographic processes is well known. Generally, the aforementioned photoconductors are prepared by known vacuum deposition, flash evaporation, and chemical vapor deposition methods. These methods possess disadvantages in some instances, thus for example with vacuum deposited chalcogenide alloys the products obtained usually lack controllable reproducibility in their homogeneity thereby adversely effecting the electrophotographic electrical characteristics thereof. As the elements selected in the source alloy for vacuum deposition usually have different vapor pressures, such elements tend to separate during the vacuum deposition process causing undesirable inhomogeneity, or fractionation thereof. Also, with vacuum deposition processes the components with high selenium content tend to evaporate first and thus are not subsequently available for deposition. Accordingly, the final photoreceptor will contain less selenium at the top surface thereof which adversely affects electrical characteristics thereof, and adds significantly to the cost of photoreceptor manufacturing or preparation primarily as a result of a reduction in total yield loss. With the processes of the present invention these and other disadvantages are avoided.

Electrophotographic photoconductive imaging members containing amorphous selenium can be modified to improve panchromatic response, increase speed and to improve color copyability. These members are usually comprised of binary and ternary chalcogenide alloys such as alloys of selenium with tellurium and/or arsenic with and without halogens. The selenium imaging members may be fabricated as single layered devices comprising a selenium-tellurium, selenium-arsenic, selenium antimony, selenium tellurium arsenic, selenium tellurium bismuth, selenium tellurium arsenic chlorine, selenium-tellurium-antimony or selenium-tellurium-arsenic alloy layer which functions as a charge generation and charge transport medium. The selenium electrophotographic imaging members may also comprise multiple layers such as, for example, a selenium alloy transport layer and a selenium alloy generator layer.

One known process for the preparation of photoreceptor comprises the vacuum deposition of a selenium alloy on a supporting substrate such as aluminum. Tellurium can be incorporated therein as an additive primarily for the purpose of enhancing the spectral sensitivity thereof. Also, arsenic can be incorporated as an additive for the primary purpose of improving wear characteristics, passivation against crystallization and improving electrical performance of the resulting photoconductor or photoreceptor. Generally, the tellurium addition can be incorporated as a thin selenium-tellurium alloy layer deposited over a selenium alloy layer to achieve the benefits of photogeneration and charge transport characteristics. Fractionation of chalcogenide alloys during the vacuum evaporation process results in an undesirable concentration gradient of, for example, tellurium and/or arsenic in the deposited photoconductor. Accordingly, there results inhomogeneities (fractionation) in the stoichiometry of the vacuum deposited thin films. Fractionation occurs, it is believed for example, as a result of differences in the partial vapor pressure of the molecular species of the solid and liquid phases of binary, ternary and other multicomponent alloys. An important aspect in the fabrication of chalcogenide based photoreceptors resides in controlling the fractonation of alloy components such as tellurium and/or arsenic and the like during the evaporation of source alloys. More specifically, tellurium and/or arsenic fractionation control is particularly important since the tellurium and/or arsenic concentration at the top surface of the resulting photoreceptor affects xerographic sensitivity, charge acceptance, dark discharge, copy quality, photoreceptor wear, cost of fabrication, crystallization resistance, and the like. For example, in single layer lower arsenic selenium alloy photoreceptors arsenic enrichment at the top surface caused by fractionation can also cause severe reticulation of the evaporated film. Further, in single layer tellurium selenium alloy photoreceptors, tellurium enrichment at the top surface due to fractionation can cause undue sensitivity enhancement, poor charge acceptance and enhancement of dark discharge. Also, in two layer or multilayer photoreceptors where low arsenic alloys may be incorporated as a transport layer, arsenic enrichment at the interface with the layer above can lead to residual cycle up problems. Moreover, in two layer or multilayer photoreceptors where tellurium alloys may be incorporated as a generator layer, tellurium enrichment at the upper surface of the charge generator layer can result in similar undue sensitivity enhancement, poor charge acceptance, and enhancement of dark discharge.

One specific method of preparing selenium alloys for evaporation comprises the grinding of selenium alloy shots (beads) and compressing the ground material into pellet agglomerates, typically from about 150 to about 300 milligrams in weight, and having an average diameter of about 6 millimeters (6,000 micrometers). The pellets are then evaporated from crucibles in a vacuum coater in a manner designed to minimize the fractionation of the alloy during evaporation. One disadvantage of the aforementioned vacuum deposited photoconductors, such as selenium-tellurium alloy layer, is the crystallization of the selenium-tellurium alloy at the surface of the layer when exposed to heat. To retard premature crystallization and extend photoreceptor life, the addition of up to about 5 percent arsenic to the selenium-tellurium alloy can be beneficial without impairment of xerographic performance. For example, when the photoreceptor comprises a single layer selenium arsenic alloy, about 1 about 2.5 percent by weight arsenic, based on the weight of the entire layer, at the surface of the alloy layer there is provided protection against surface crystallization. When the concentration of arsenic is greater than about 2.5 percent by weight, electrical instability risks increase.

Also, in deposited layers of selenium tellurium alloys the amounts of top surface tellurium present can cause excessively high photosensitivity. This photosensitivity is variable and changes as the surface of the layer wears away. Surface injection of corona deposited charge and thermally enhanced bulk dark decay involving carrier generation cause the toner images in the final copies to exhibit a washed out, low density appearance. Excessive dark decay causes loss of high density in solid areas of toner images and general loss of image density.

There were located as a result of a patentability search U.S. Pat. Nos. 4,615,964; 4,013,463; 4,540,652; 4,554,230; and 4,019,902. In the '964 patent, there is disclosed mixing or melting selenium with a predetermined amount of selenium dioxide, reference, for example, the Abstract of the Disclosure and column 2. In the '463 and '902 patents, there are disclosed durable photoreceptors having improved flexibility comprising a metal or metal coated flexible substrate and an organic photoconductive layer wherein the photoreceptor is obtained by initially bombarding the metal substrate as an electrode with both negative and positive ions or an inert gas, reference the Abstracts of the Disclosure. U.S. Pat. No. 4,540,652 discloses a material of an electrically conductive support and a dielectric layer containing a binder of a certain percent therein, and 20 to 83 of a finely divided mixed pyrogenic silicon and titanium oxide containing between 10 and 50 percent by weight of titanium, see the Abstract of the Disclosure, for example. The '230 patent illustrates an imaging member, and indicates in column 6 that the selenium-tellurium alloy generating layer can be prepared in one preferred embodiment by grinding and following the other steps stated, which are designed to minimize the fractionation of the alloy during evaporation, reference column 6, lines 15 and 16.

One known method for attempting to control fractionation is the selection of shutters for incorporation over the evaporation crucibles. Shutters are normally selected after evaporation is substantially completed to avoid the coating of, for example, tellurium and arsenic rich species on the photoreceptor. This can result in a photoreceptor or photoconductor with a top surface containing desired levels of tellurium and arsenic. Further, shutters can be utilized at initiation of evaporation of elements from the crucible to avoid sputtering. The aforesaid shuttering is generally costly, usually requires incomplete evaporation, and further the crucibles selected have to be cleaned after each evaporation. Furthermore, with shuttering generally a substantial amount of the source material is lost during the process.

Accordingly, a problem encountered in the fabrication of chalcogenide alloy photoreceptors, such as known selenium alloy photoreceptors, is the fractionation or preferential evaporation of a component whereby the resulting film composition is not equivalent to the source component, such as the source alloy, thus the deposited film or layer does not have a uniform composition extending from one surface (top) to the other surface (bottom). For example, with selenium tellurium alloys containing from about 10 to about 60 percent by weight of tellurium, the tellurium concentration is high at the top surface and very low, that is it approaches almost zero, at the bottom of the vacuum deposited layer. This problem is observed with, for example, alloys of Se-Te, Se-As, Se-As-Te, Se-As-Te-Cl, mixtures thereof, and the like.

In U.S. Pat. No. 4,770,965, the disclosure of which is totally incorporated herein by reference, there is disclosed a process which includes heating an alloy comprising selenium and from about 0.05 percent to about 2 percent by weight arsenic until from about 2 percent to about 90 percent by weight of the selenium in the alloy is crystallized, vacuum depositing the alloy on a substrate to form a vitreous photoconductive insulating layer having a thickness of between about 100 micrometers and about 400 micrometers containing between about 0.3 percent and about 2 percent by weight arsenic at the surface of the photoconductive insulating layer in a direction facing away from the conductive substrate, and heating the photoconductive insulating layer until only the selenium in the layer adjacent the substrate crystallizes to form a continuous substantially uniform crystalline layer having a thickness up to about one micrometer. A thin protective overcoating layer can then be applied on the photoconductive insulating layer. The selenium-arsenic alloy may be partially crystallized by placing the selenium alloy in shot form in a crucible in a vacuum coater and heating to between about 93° C. (200° F.) and about 177° C. (350° F.) for between about 20 minutes and about one hour to increase crystallinity and avoid reticulation. Preferably, the selenium-arsenic alloy material in shot form is heated until from about 2 percent to about 90 percent by weight of the selenium in the alloy is crystallized. The selenium-arsenic alloy material shot may be crystallized completely prior to vacuum deposition to ensure that a uniform starting point is employed. However, if desired, a completely amorphous alloy may be used as the starting material for vacuum deposition. In Examples II and V of this patent, halogen doped selenium-arsenic alloy shot contained about 0.35 percent by weight arsenic, about 11.5 parts per million by weight chlorine, and the remainder selenium, based on the total weight of the alloy, was heat aged at 121° C. (250° F.) for 1 hour in crucibles in a vacuum coater to crystallize the selenium in the alloy. After crystallization, the selenium alloy was evaporated from chrome coated stainless steel crucibles at an evaporation temperature of between about 204° C.(400° F.) and about 288° C.(550° F.).

U.S. Pat. No. 4,780,386, the disclosure of which is totally incorporated herein by reference, illustrates a process wherein the surfaces of large particles of an alloy comprising selenium, tellurium and arsenic, the particles having an average particle size of at least 300 micrometers and an average weight of less than about 1,000 milligrams, are mechanically abraded while maintaining the substantial surface integrity of the large particles to form between about 3 percent by weight to about 20 percent by weight dust particles of the alloy based on the total weight of the alloy prior to mechanical abrasion. The alloy dust particles are substantially uniformly compacted around the outer periphery of the large particles of the alloy. The large particles of the alloy may be beads of the alloy having an average particle size of between about 300 micrometers and about 3,000 micrometers or pellets having an average weight between about 50 milligrams and about 1,000 milligrams, the pellets comprising compressed finely ground particles of the alloy having an average particle size of less than about 200 micrometers prior to compression. In one embodiment, the process comprises mechanically abrading the surfaces of beads of an alloy comprising selenium, tellurium and arsenic having an average particle size of between about 300 micrometers and about 3,000 micrometers while maintaining the substantial surface integrity of the beads to form a minor amount of dust particles of the alloy, grinding the beads and the dust particles to form finely ground particles of the alloy, and compressing the ground particles into pellets having an average weight between about 50 milligrams and about 1,000 milligrams. In another embodiment of the patent, mechanical abrasion of the surface of the pellets after the pelletizing step may be substituted for mechanical abrasion of the beads. The process includes providing beads of an alloy comprising selenium, tellurium and arsenic having an average particle size of between about 300 micrometers and about 3,000 micrometers, grinding the beads to form finely ground particles of the alloy having an average particle size of less than about 200 micrometers, compressing the ground particles into pellets having an average weight between about 50 milligrams and about 1,000 milligrams, and mechanically abrading the surface of the pellets to form alloy dust particles while maintaining the substantial surface integrity of the pellets.

In U.S. Pat. No. 4,822,712, the disclosure of which is totally incorporated herein by reference, there are illustrated processes for controlling fractionation. More specifically, there are disclosed in this patent processes for crystallizing particles of an alloy of selenium comprising providing particles of an alloy comprising amorphous selenium and alloying component selected from the group consisting of tellurium, arsenic, and mixtures thereof, said particles having an average size of at least about 300 micrometers and an average weight of less than about 1,000 milligrams, forming crystal nucleation sites on at least the surface of said particles while maintaining the substantial integrity of said particles, heating the particles to at least a first temperature between the about 50° C. and about 80° C. for at least about 30 minutes to form a thin, substantially continuous layer of crystalline material at the surface of the particles while maintaining the core of selenium alloy in said particles in an amorphous state, and rapidly heating said particles to at least a second temperature below the softening temperature of said particles, the second temperature being at least 20° C. higher than the first temperature and between about 85° C. and about 130° C. to crystallize at least about 5 percent by weight of said amorphous core of selenium alloy in the particles.

In U.S. Pat. No. 4,894,307, entitled Processes for Preparing and Controlling the Fractionation of Chalcogenide Alloys, and U.S. Pat. No. 4,904,559, entitled Processes for Suppressing the Fractionation of Chalcogenide Alloys, the disclosures of which are totally incorporated herein by reference, there are illustrated, for example, processes for the control of fractionation by adding to a source alloy, amorphous or crystalline selenium, such as trigonal selenium; or by effecting the crystallization of the source alloy. More specifically, there is disclosed in U.S. Pat. No. 4,904,559 a process for the preparation of chalogenide alloy compositions which comprises providing a chalcogenide alloy; admixing therewith crystalline or amorphous selenium; and subsequently subjecting the resulting mixture to evaporation; and in U.S. Pat. No. 4,894,307 a process for the preparation of chalcogenide alloys which comprises providing a chalcogenide alloy source component; crystallizing the source component; and evaporating the source component in the presence of an organic component.

There is described in U.S. Pat. No. 4,205,098 a process wherein a powdery material of selenium alone or at least with one additive is compacted under pressure to produce tablets, the tablets being degassed by heating at an elevated temperature and below the melting point of the metallic selenium, and thereafter using the tablets as a source for vacuum deposition. The tablets formed by compacting the powdery selenium under pressure may be sintered at a temperature between about 100° C. and about 220° C. Typical examples of sintering conditions include 210° C. for between about 20 minutes and about 1 hour and about 1 about 4 hours at 100° C. depending, for example, upon compression pressure. Additives mentioned in the '098 patent include Te, As, Sb, Bi, Fe, Tl, S, I, F, Cl, Br, B, Ge, PbSe, CuO, Cd, Pb, BiCl$_3$, Sb$_2$S$_3$, Bi$_2$, S$_3$, Zn, CdS, CdSe, CdSes, and the like.

Illustrated in U.S. Pat. No. 4,609,605 is a multilayered electrophotographic imaging member wherein one of the layers may comprise a selenium-tellurium-arsenic alloy prepared by grinding selenium-tellurium-arsenic alloy beads, with or without halogen doping, preparing pellets having an average diameter of about 6 millimeters from the ground material, and evaporating the pellets in crucibles in a vacuum coater. Other prior art includes U.S. Pat. No. 4,297,424, which describes a process for preparing a photoreceptor wherein selenium-tellurium-arsenic alloy shot is ground, formed into pellets and vacuum evaporated; U.S. Pat. No. 4,554,230, which discloses a method for fabricating a photoreceptor wherein selenium-arsenic alloy beads are ground, formed into pellets and vacuum evaporated; U.S. Pat. No. 3,524,754 directed to a process for preparing a photoreceptor wherein selenium-arsenic-antimony alloys are ground into fine particles and vacuum evaporated; and U.S. Pat. No. 4,710,442 relating to an arsenic-selenium photoreceptor, wherein the concentration of arsenic increases from the bottom surface to the top surface of the photoreceptor, that the arsenic concentration is about 5 weight percent at a depth about 5 to 10 microns on the top surface of the photoreceptor and is about 30 to 40 weight percent at the top surface of the photoreceptor, which photoreceptor can be prepared by heating a mixture of selenium-arsenic alloys in a vacuum in a step-wise manner such that the alloys are consequentially deposited on the substrate to form a photoconductive film with an increasing concentration of arsenic from the substrate interface to the top surface of the photoreceptor. In one specific embodiment, a mixture of 3 selenium-arsenic alloys are maintained at an intermediate temperature in the range of from about 100° to 130° C. for a period of time sufficient to dry the mixture. Further, in U.S. Pat. No. 4,583,608 there is disclosed the heat treatment of single crystal super alloy particles by using a heat treatment cycle during the initial stages of which incipient melting occurs within the particles being treated. During a subsequent step in the heat treatment process, substantial diffusin occurs in the particle. In a related embodiment, single crystal particles which have previously undergone incipient melting during a heat treatment process are prepared by a heat treatment process. In still another embodiment, a single crystal composition of various elements, including chromium and nickel, is treated to heating steps at various temperatures. Other prior art includes U.S. Pat.

Nos. 4,585,621; 4,632,849; 4,484,945; 4,414,179; 4,015,029 and 3,785,806; Swiss Patent CH 656486 A5; and Japanese Patents 60-172346 and 57-91567.

There is illustrated in U.S. Pat. No. 4,513,031 a process for the formation of an alloy layer on the surface of a substrate, which for example comprises forming in a vessel a molten bath comprising at least one varporizable alloy component having a higher vapor pressure than at least one other vaporizable alloy component in the bath, forming a thin substantially inert liquid layer of an evaporation retarding film on the upper surface of the molten bath, the liquid layer of the evaporation retarding film having a lower or comparable vapor pressure than both the vaporizable alloying component having a higher vapor pressure and the other vaporizable alloying component, covaporizing at least a portion of both the vaporizable alloying component having a higher vapor pressure and the other vaporizable alloying component whereby the evaporation retarding film retards the initial evaporation of the vaporizable alloying component having a higher vapor pressure, and forming an alloy layer comprising both the vaporizable alloying component having a higher vapor pressure and the other vaporizable alloying component on the substrate, see column 3, lines 33 to 54, for example. Examples of vaporizable alloying components include selenium-sulfur and the like, and examples of vaporizable alloying components having relatively low vapor pressures which include tellurium, arsenic, antimony, bismuth, and the like are illustrated in column 4, reference for example lines 41 to 50. Examples of suitable evaporation retarding film materials are outlined in column 4 at line 54, and continuing onto column 5, line 36, such materials include inert oils, greases or waxes at room temperature which readily flow less than the temperature of detectable deposition of the vaporizable alloying components having higher vapor pressures in the alloying mixtures, and may include, for example, long chain hydrocarbon oils, greases, and waxes, lanolin, silicone oils such as dimethylpolysiloxane, branched or linear polyolefins such as polypropylene wax and polyalpha olefin oils, and the like, see column 5. According to the teachings of this patent, optimum results are achieved with high molecular weight long chain hydrocarbon oils and greases generally refined by molecular distillation to have low vapor pressure at the alloy deposition temperature, see column 5, lines 32 to 36. It is believed with the aforementioned process that the levels of organics, which are incorporated into the resulting alloy film, are sufficiently high causing negative adverse effects in the electrical properties of the resulting photoreceptor, for example dark decay and cyclic stability are adversely effected.

SUMMARY OF THE INVENTION

It is an object of the present invention to provide processes for the preparation of chalcogenide alloys.

Another object of the present invention is the provision of processes for the preparation of chalcogenide alloys wherein fractionation is minimized.

Further, in another object of the present invention there are provided processes for the preparation of selenium alloys wherein fractionation is substantially avoided.

It is a further object of the present invention to provide an improved process which controls arsenic and tellurium fractionation within specific ranges in alloy products thereof.

It is a further object of the present invention to provide an improved process wherein metal oxides are added to a chalcogenide alloy source material prior to evaporation thereby controlling fractionation.

Moreover, in a further object of the present invention there are provided processes wherein small amounts of metal oxides, such as tellurium dioxide, are added to a chalcogenide alloy source material prior to evaporation thereby controlling fractionation.

Also, in a further object of the present invention there are provided processes wherein small amounts of metal oxides, such as tellurium dioxide, are added to a chalcogenide alloy source materials prior to evaporation thereby controlling fractionation, and reducing the amount of, for example, arsenic at the top surface of the resulting photoconductor to from about 0.5 to about 1, and preferably 0.8 percent.

Additionally, in a another object of the present invention there are provided processes wherein metal oxides are added to a chalcogenide alloy source material, such as selenium arsenic, prior to evaporation thereby forming, it is believed, a crust comprised of mixed metal oxides on the surface of the source alloy which functions as a blanket thereby, for example, initial losses of selenium rich species are avoided, or substantially minimized enabling the formation of an evaporated alloy film product with minimum fractionation. By mixed metal oxide rich species is meant, for example, oxides with a lower vapor pressure than the alloy thereby providing a blanket on the surface of the alloy as indicated herein in the vacuum coater, and as a result the undesirable early loss of the selenium rich species, which is normally a cause of fractionation, which is prevented or minimized with the process of the present invention. For example, mixed metal oxides are formed by the chemical reaction of a metal oxide as it contacts selenium-arsenic, selenium-tellurium, or other similar source alloys, with arsenic and/or tellurium components of the alloy. It is believed that the metal oxides selected for the process of the present invention reacts with elements, or an element in some instances present in the source alloy whereby there is formed mixed metal oxides. The aforementioned metal oxides are illustrated in the *Journal Chemical Society*, Dalton Press, page 733, (1982), the disclosure of which is totally incorporated herein by reference. Further, mainly since the metal oxide or oxide with the process of the present invention is primarily added usually at the surface, it induces a surface reaction and as a result the surface thereof is richer in these oxides thereby providing a blanket which suppresses the early loss of the selenium rich species for example. Thus, with the process of the present invention high fractionization is avoided, that is, for example, there is not a substantial decrease in the amount of tellurium or arsenic, and the like present in the final selenium alloy product beginning at the top surface thereof and continuing to the bottom surface. In one example, the aforementioned total thickness is about 55 microns as illustrated herein.

In another object of the present invention there are provided processes wherein metal oxides are added to the chalcogenide alloy source material, such as selenium arsenic, prior to evaporation thereby, it is believed, forming a crust of metal oxides on the surface of the source alloy, such as selenium-arsenic, and preventing the loss of this component during evaporation primarily since the new species has a lower partial vapor pressure.

It is a further object of the present invention to provide an improved process which reduces the level of tellurium or arsenic fractionation.

Furthermore, it is another object of the present invention to provide an improved process which reduces the tellurium or arsenic stoichiometric distribution variation throughout the thickness of a selenium-tellurium or selenium-arsenic alloy photoconductive layer.

Another object of the present invention is to provide an improved process which controls the mechanical wear characteristics of the photoreceptor surface.

Also, in another object of the present invention there is provided a process which limits the loss of selenium rich species during the vacuum deposition process.

It is a further object of the present invention to provide processes that provide evaporated films of selenium and its alloys with arsenic and/or tellurium which have superior photoconductive properties for extended time periods.

Another object of the present invention is to provide processes for controlling the electrical cycling characteristics and photosensitivity of many photoreceptors within a narrow range. When fractionation is not controlled, that is when there results uneven distributions of tellurium or arsenic, for example, throughout the alloy photoreceptor or film product, it is very difficult to predict the photosensitivity, the cyclic characteristics, and the dark decay properties of the photoreceptor. This results from the variation in fractionation from photoreceptor to photoreceptor. However, once the distribution of the elements is controlled throughout the film or the alloy product with the process of the present invention there is obtained predictable and consistent desired characteristics.

The above and other objects of the present invention are accomplished by providing a process for the preparation of and for controlling the fractionation of chalcogenide alloys. More specifically, the present invention is directed to a process which comprises providing a chalcogenide alloy, adding thereto metal oxides, or a metal oxide, such as tellurium oxide, and thereafter subjecting the resulting components to evaporation enabling the formation of a photoconductor with improved characteristics as illustrated herein. In one specific embodiment of the present invention, there is provided a process which comprises providing a chalcogenide alloy such as an alloy containing selenium, including selenium arsenic alloys; admixing therewith a metal oxide in an amount of, for example, from about 0.1 to about 15, and preferably from about 2 to about 5 percent by weight; subjecting the resulting components to evaporation by heating at a temperature of from about 250 to about 450, and preferably 350° C.; and depositing on a supporting substrate the desired chalcogenide alloy with reduced fractionation. Another specific embodiment of the present invention relates to a process which comprises providing a selenium tellurium alloy containing from about 95 to about 60 percent by weight of selenium; admixing therewith a metal oxide, such as tellurium dioxide, and the like in an amount of from about 0.1 to about 10, and preferably from about 2 to about 5 weight percent; subjecting the resulting components to evaporation by heating at a temperature of from about 300° to about 400° C.; and depositing on a supporting substrate the desired chalcogenide alloy with reduced fractionation, that is distribution of the elements in the alloy product in an almost substantially homogeneous manner throughout the photoreceptor.

In a specific embodiment of the present invention, the process comprises adding to boats contained in a vacuum coater about 50 grams of selenium arsenic alloy shots containing about 98 weight percent of selenium, and 2 weight percent of arsenic. About two grams of selenium oxide powder was then sprinkled by a powered funnel on the surface of the aforementioned alloy shots. After evaporation of 350° C. at a vacuum of $10^{-5}$ Torr, there resulted a thin film, about 55 microns thick, of a selenium arsenic alloy (98/2). A surface analysis of the product alloy film by EMPA (Electrom Microprobe) indicated that the arsenic content, in the top 0.1 micron surface, averaged 3.1 percent. Repeating the above process without the selenium oxide resulted in a selenium arsenic alloy with a top surface arsenic content of from about 9 to about 23.5 weight percent. EMPA also indicated that the stoichiometric distribution of the arsenic was homogeneous throughout the evaporated film product in a situation when the metal oxide is added, while with the control where no metal oxide was selected a highly fractionated alloy film resulted indicating that there was an arsenic content gradient beginning with the top of the film and moving towards the bottom of the alloy film product.

Other embodiments of the present invention are directed to a process for controlling the fractionation of selenium alloys which comprises providing a selenium alloy, admixing therewith a metal oxide, and subsequently subjecting the resulting mixture to evaporation; a process for the preparation of chalcogenide alloys which comprises the evaporation of a chalcogenide alloy and metal oxide, or a mixture of metal oxides; a process for controlling the fractionation of chalcogenide alloy compositions which comprises providing a chalcogenide alloy; admixing therewith a metal oxide; and subsequently subjecting the resulting mixture to evaporation; a process for controlling the fractionation of selenium alloy compositions which comprises providing a selenium alloy, admixing therewith a metal oxide, and subsequently subjecting the resulting mixture to evaporation; a process for controlling the fractionation of a chalcogenide alloy which comprises providing a chalcogenide alloy, admixing therewith a metal oxide, and subsequently subjecting the resulting mixture to evaporation by heating; a process for the preparation of a chalcogenide alloy which comprises the evaporation of a mixture of chalcogenide alloy and a metal oxide; and a process for controlling the fractionation of a chalcogenide alloy which comprises the evaporation of a chalcogenide alloy and a metal oxide.

The substrate, usually up to about 150 mils in thickness, and preferably from about 75 to about 100 mils in thickness selected for the deposited chalcogenide alloy product obtained with the process of the present invention, may be opaque or substantially transparent and may comprise numerous suitable materials having the desired mechanical properties. The entire substrate may comprise an electrically conductive surface or an electrically conductive surface may be present as coating on the substrate. Various suitable electrically conductive materials may be employed as the substrate. Typical electrically conductive materials include, for example, aluminum, titanium, nickel, chromium, brass, stainless steel, copper, zinc, silver, tin, and the like. The optional conductive layer, such as aluminum, on the substrate may vary in thickness depending on the desired use of the electrophotoconductive member. Accordingly, this conductive layer may be of a thickness of from about 50

Angstroms to about 5,000 Angstroms. Generally, the substrate may be of any conventional material including organic and inorganic materials. Further substrate examples include insulating nonconducting materials such as various resins known for this purpose including polyesters, polycarbonates, polyamides, polyurethanes, and the like. The coated or uncoated substrate may be flexible or rigid and may have any number of configurations such as, for example, a plate, a cylindrical drum, a scroll, an endless flexible belt, and the like. The outer surface of the supporting substrate preferably comprises a metal oxide such as aluminum oxide, nickel oxide, titanium oxide, and the like. One fixed substrate selected is comprised of thick aluminum sheets, drums, flexible substrates, such as Mylar, in suitable effective thickness as indicated herein, reference U.S. Pat. No. 4,265,990, the disclosure of which is totally incorporated herein by reference, and the like.

In some situations, intermediate adhesive layers between the substrate and subsequently applied layers, such as the alloy product, may be desirable to improve adhesion. Preferably, these layers have a dry thickness of between about 0.1 micrometer to about 5 micrometers. Examples of adhesive layers include film-forming polymers such as polyester, including 49,000 polyester available from Goodyear Chemical, polyvinylbutyral, polyvinylpyrrolidone, polycarbonate, polyurethane, polymethylmethacrylate, and the like, and mixtures thereof.

Any suitable photoconductive chalcogenide alloy including binary, tertiary, quaternary, alloys or the like, may be employed as the source alloy for the processes of the present invention and, for example to enable the formation of the vacuum deposited photoconductive layer. Preferred alloys include alloys of selenium with tellurium, arsenic, or tellurium and arsenic with or without a halogen dopant. Examples of photoconductive source alloys and alloy products obtained with the process of the present invention, include selenium-tellurium, selenium-arsenic, selenium-tellurium-arsenic, selenium-tellurium-chlorine, selenium-arsenic-chlorine, selenium-tellurium-arsenic-selenium-antimony, chlorine alloys, and the like. Generally, the selenium-tellurium alloy may comprise between about 5 percent by weight and about 40 percent by weight tellurium and optionally a halogen selected from the group consisting of up to about 70 parts per million by weight of chlorine and up to about 140 parts per million by weight of iodine all based on the total weight of the alloy with the remainder being selenium. The selenium-arsenic alloy (reactant or product) may, for example, comprise between about 0.01 percent by weight and about 40 percent by weight arsenic and optionally a halogen selected from the group consisting of up to about 200 parts million by weight of chlorine and up to about 1,000 parts per million by weight of iodine all based on the total weight of the alloy with the remainder being selenium. The selenium-tellurium-arsenic alloy may comprise between about 5 percent by weight and about 40 percent by weight tellurium, between about 0.1 percent by weight and about 5 percent by weight arsenic and a halogen selected from the group consisting of up to about 200 parts per million by weight of chlorine and up to about 1,000 parts per million by weight of iodine all based on the total weight of the alloy with the remainder being selenium. The terms alloy of selenium and selenium alloy as presented herein are intended to include halogen doped alloys as well as alloys not doped with halogen, and other known or similar alloys. The thickness of the aforementioned photoconductive chalcogenide alloy layer is generally between about 0.1 micron and about 400 microns. Other thicknesses may be selected provided the objectives of the present invention are achieved.

Illustrative examples of metal oxides usually selected in an amount of, for example, from about 0.1 to about 15, and preferably from about 10 to about 6 weight percent and mixed with or added to the source alloy prior to evaporation thereof include tellurium dioxide, selenium dioxide, bismuth oxide, tin oxide, copper oxide, antimony oxide, nickel oxide, silver oxide, manganese oxide, silicon oxide, aluminum oxide, calcium oxide, barium oxide, titanium oxide, arsenic oxide, and the like. The preferred oxides are selenium, tellurium, arsenic, tin, and bismuth. Also, other amounts of metal oxides can be selected providing the objectives of the present invention are achievable.

Selenium-tellurium and selenium-tellurium-arsenic alloy photoconductive layer products are frequently employed as a charge generation layer in combination with a charge transport layer. The charge transport layer is usually positioned between a supporting substrate and the charge generating selenium alloy photoconductive layer. Generally, a selenium-tellurium alloy photogenerating layer may comprise from about 40 percent by weight to about 95 percent by weight selenium, and from about 5 percent by weight to about 60 percent by weight tellurium based on the stoichiometric amount of the alloy. The selenium-tellurium alloy may also comprise other components such as less than about 40 percent by weight arsenic to minimize crystallization of the selenium and less than about 1,000 parts per million by weight halogen. In a more preferred embodiment, the photoconductive charge generating selenium alloy layer comprises between about 5 percent by weight and about 25 percent by weight tellurium, between about 0.1 percent by weight and about 4 percent by weight arsenic, and a halogen selected from the group consisting of up to about 100 parts per million by weight of chlorine and up to about 300 parts per million by weight of iodine with the remainder being selenium. It is desirable, in general, to achieve uniformly homogeneous compositions within the evaporated layers, that is to evaporate the alloy source materials without significant fractionation. Elevated (that is the amount of tellurium or arsenic which is usually higher is present in the final alloy as compared to the initial source alloy) levels of tellurium on the top surface lead to excessive photoreceptor light sensitivity and high dark decay, and correspondingly reduced copy quality with, for example, undesirable background deposits. Elevated levels of arsenic in some applications above about, for example, 4 percent by weight can result in high dark decay to problems in cycling stability and to reticulation of the photoreceptor surface.

Any suitable selenium alloy transport layer may be utilized in the aforementioned layered imaging member. Examples of these layers include pure selenium, selenium-arsenic alloys, selenium-arsenic-halogen alloys, selenium-halogen and the like. Preferably, the charge transport layer comprises a halogen doped selenium arsenic alloy. Generally, about 10 parts by weight per million to about 200 parts by weight per million of halogen is present in a halogen doped selenium charge transport layer. When the halogen doped transport layer free of arsenic is utilized, the halogen content should normally be less than about 20 parts by weight per million. Inclusion of high levels of halogen in a thick halogen doped selenium charge transport layer free of arsenic may cause excessive dark decay. Imaging members containing high levels of halogen in a thick halogen doped selenium charge transport layer free of arsenic are described, for example, in U.S. Pat. No. 3,635,705 and 3,639,120, the disclosures of which are totally incorporated herein by reference, and Ricoh Japanese Patent Publication No. J5 61 42-537 published June 6, 1981, the disclosures of which are totally incorporated herein by reference. Generally, halogen doped selenium arsenic alloy charge transport layers comprise between about 99.5 percent by weight to about 99.9 percent by weight selenium, about 0.1 percent to about 0.5 percent by weight arsenic, and between about 10 parts per million by weight to about 200 parts per million by weight of halogen, the latter halogen concentration being a nominal concentration. Halogen includes fluorine, chlorine, bromine, and iodine. Chlorine is preferred primarily because of its stability. Transport layers are described, for example, in U.S. Pat. Nos. 4,609,605 and 4,297,424, the disclosures of which are totally incorporated herein by reference.

The first layer of multiple layered photoreceptors, such as a transport layer, may be deposited by any suitable conventional technique, such as vacuum evaporation. Thus, a transport layer comprising a halogen doped selenium-arsenic alloy comprising less than about 1 percent arsenic by weight may be evaporated by conventional vacuum coating devices to form the desired thickness. The amount of alloy to be employed in the evaporation boats of the vacuum coater will depend on the specific coater configuration and other process variables to achieve the desired transport layer thickness. Chamber pressure during evaporation may be on the order of about $4 \times 10^{-5}$ Torr. Evaporation is normally completed in about 15 to 25 minutes with the molten alloy temperature ranging from about 250° C. to about 325° C. Other times and temperatures and pressures outside these ranges may be used as well understood by those skilled in the art. It is generally desirable that the substrate temperature be maintained in the range of from about 50° C. to about 70° C. during deposition of the transport layer. Additional details for the preparation of transport layers are illustrated, for example, in U.S. Pat. No. 4,297,424, the disclosure of which is totally incorporated herein by reference.

Fractionation control with the process of the present invention is sufficient to the extent that photoreceptors with acceptable and predictable electrical properties for extended time periods may be fabricated with generator layers of selenium-tellurium and selenium-tellurium arsenic having thicknesses up to about 60 microns, other thicknesses as indicated herein, or other thicknesses providing the objectives of the present invention are achieved.

The following examples are being submitted to further define various species of the present invention. These examples are intended to be illustrative only and are not intended to limit the scope of the present invention. Also, parts and percentages are by weight unless otherwise indicated.

EXAMPLE I

Fifty (50) grams of selenium-tellurium source alloy shots with 14.5 weight percent of tellurium, 85.5 percent of selenium, and 20 parts per million of chlorine was charged into a crucible present in a vacuum deposition 18 inch bell jar coater. The alloy shots were evenly spread in the coater by a spatula. After evaporation at a crucible temperature of 350° C. and a vacuum of $4 \times 10^{-5}$ Torr, there was coated an alloy product, 85.5 percent selenium and 14.5 percent of tellurium over a period of 18 minutes on an aluminum substrate of a thickness of 10 mils and maintained at 55° C. An EMPA (electron microprobe analysis) indicated that the alloy film product was highly fractionated, that is the tellurium content decreased from the top surface down to the bottom surface of the film product which was of a thickness of 50 microns. More specifically, at the bottom surface of the alloy product film there was present about 2 percent by weight of tellurium. Also, the average amount of tellurium on the top 0.1 and 0.5 micron on the alloy product was 36.8 and 50.3 weight percent, respectively.

EXAMPLE II

The process of Example I was repeated with the exception that 0.5 grams of tellurium dioxide was sprinkled on the surface of the alloy shots present in the crucible. There resulted a selenium tellurium-alloy (85.5/14.5) product. EMPA analysis evidenced a relatively flat tellurium profile, that is substantially no tellurium fractionation, and that the top 0.1 and 0.5 micron of the alloy with a thickness of 50 microns had tellurium concentrations of 17.2 and 17.3 weight percent, respectively.

EXAMPLE III

The process of Example II was repeated with the exception that 3.0 grams of the tellurium dioxide was sprinkled onto the surface of the alloy shots present in the crucible. EMPA analysis evidenced a relatively flat tellurium profile, that is substantially no tellurium fractionation, and that the top 0.1 and 0.5 micron of the alloy had tellurium concentrations of 18 and 18.7 weight percent, respectively.

EXAMPLE IV

The process of Example I was repeated with the exceptions that 50 grams of selenium tellurium alloy shots with 10.7 weight percent of tellurium was selected in place of the selenium tellurium alloy 85.5/14.5, the crucible temperature was maintained at 350° C., and the coating was completed in 22 minutes. The alloy product film, 89.3 percent selenium, 10.7 percent of tellurium, was of a thickness of 55 microns. EMPA analysis of the alloy obtained indicated high fractionation and the top 0.1 and 0.5 micron of the alloy had tellurium concentrations of 17.6 and 17.7 weight percent, respectively. At the bottom of the 55 micron film product there was present about 2 weight percent of tellurium indicating a highly fractionated film alloy.

EXAMPLE V

The process of Example IV was repeated with the exception that 2.5 grams of tellurium dioxide was sprinkled on the alloy shots present in the crucible. There resulted a selenium-tellurium alloy film (89.3/10.7) product. EMPA analysis evidenced a relatively flat tellurium profile, that is substantially no tellurium fractionation, and that the top 0.1 and 0.5 micron on the alloy had tellurium concentrations of 11.9 and 12.3 weight percent, respectively. At the bottom of the 50 micron film product there was present about 8.5 weight percent of tellurium, indicating that there was substantially no fractionation of the alloy product.

EXAMPLE VI

The process of Example II was repeated with the exception that 1 gram of tin oxide was sprinkled on the alloy shots present in the crucible. There resulted a selenium-tellurium alloy film (85.5/14.5) product. EMPA analysis evidenced for the aforementioned alloy product with a thickness of 50 microns a relatively flat tellurium profile, that is substantially no tellurium fractionation, and that the top 0.1 and 0.5 micron of the alloy had tellurium concentrations of 16.9 and 17.1 weight percent, respectively. At the bottom of the 50 micron film product there was present about 12.3 weight percent of tellurium indicating that there was substantially no fractionation of the alloy product.

EXAMPLE VII

The process of Example II was repeated with the exception that 2.5 grams of bismuth oxide was sprinkled on the alloy shots present in the crucible. There resulted a selenium-tellurium alloy film (85.5/14.5) product. EMPA analysis evidenced for the aforementioned alloy product with a thickness of 50 microns a relatively flat tellurium profile, that is substantially no tellurium fractionation, and that the top 0.1 and 0.5 micron of the alloy had tellurium concentrations of 17.8 and 18.1 weight percent, respectively. At the bottom of the 50 micron film product there was present about 12.1 weight percent of tellurium indicating that there was substantially no fractionation of the alloy product.

EXAMPLE VIII

The process of Example I was repeated with the exceptions that 50 grams of selenium arsenic alloy shots with 2 weight percent of arsenic were selected in place of the selenium-tellurium alloy (85.5/14.5), the crucible temperature was maintained at 325° C., and the coating was completed in 20 minutes. The alloy product film, 98 percent selenium, 2.0 percent of arsenic, was of a thickness of 55 microns. EMPA analysis of the alloy indicated high arsenic fractionation, and the top 0.1 and 0.5 micron of the alloy had arsenic concentrations of 15.3 and 17.7 weight percent, respectively. At the bottom of the 55 micron film product there was present about 0.02 weight percent of arsenic indicating a highly fractionated alloy film.

EXAMPLE IX

The process of Example IV was repeated with the exception that 2.5 grams of selenium dioxide was sprinkled on the alloy shots present in the crucible. There resulted a selenium arsenic alloy film (98/2) product. EMPA analysis evidenced a relatively flat arsenic profile, that is substantially no arsenic fractionation, and that the top 0.1 and 0.5 micron of the alloy had arsenic concentrations of 3.1 and 3.8 weight percent, respectively. At the bottom of the 50 micron film product there was present about 1.5 weight percent of arsenic, indicating that there was substantially no fractionation of the alloy product.

Thus, with the processes of the present invention the alloy products obtained are not highly fractionated as indicated herein.

Although the invention has been described with reference to specific preferred embodiments, it is not intended to be limited thereto, rather those of ordinary skill in the art will recognize that variations and modifications may be accomplished. These modifications, especially equivalents thereof, are encompassed by the present invention and are within the scope of the claims.

What is claimed is:

1. A process for the preparation of chalcogenide alloy compositions which comprises providing a chalcogenide alloy; admixing therewith a metal oxide in an amount from about 0.1 to about 15 percent by weight; whereby a metal oxide crust is formed on the chalcogenide alloy; and subsequently subjecting the resulting mixture to evaporation.

2. A process in accordance with claim 1 wherein the metal oxide is tellurium dioxide, bismuth oxide, tin oxide, or selenium oxide.

3. A process in accordance with claim 1 wherein the chalcogenide alloy resulting is deposited on a substrate.

4. A process in accordance with claim 1 wherein the chalcogenide alloy is comprised of a selenium-arsenic alloy.

5. A process in accordance with claim 4 wherein the alloy contains about 0.5 percent by weight of arsenic.

6. A process in accordance with claim 4 wherein the alloy contains about 2 percent by weight of arsenic.

7. A process in accordance with claim 1 wherein the chalcogenide alloy is comprised of a selenium-tellurium alloy.

8. A process in accordance with claim 1 wherein the metal oxide is tellurium dioxide.

9. A process for controlling the fractionation of selenium alloys witch comprises providing a selenium alloy; admixing therewith a metal oxide, in an amount from about 0.1 to about 15 percent by weight whereby a metal oxide crust is formed on the selenium alloy; and subsequently subjecting the resulting mixture to evaporation.

10. A process in accordance with claim 9 wherein the alloy is comprised of selenium-arsenic, selenium-tellurium, or selenium tellurium arsenic.

11. A process in accordance with claim 9 wherein the metal oxide is admixed in an amount of from about 2 to about 10 percent by weight.

12. A process in accordance with claim 9 wherein there results a selenium-arsenic alloy with from about 0.3 to about 2 percent by weight of arsenic.

13. A process in accordance with claim 9 wherein there results a selenium-tellurium alloy composition with from about 5 to about 40 percent by weight of tellurium.

14. A process in accordance with claim 9 wherein evaporation is accomplished by heating at a temperature of from about 250° to about 450° C.

15. A process in accordance with claim 9 wherein the selenium alloy resulting is deposited on a substrate.

16. A process in accordance with claim 9 wherein the selenium alloy is comprised of selenium-arsenic-chlorine with arsenic being present in an amount of 0.5 weight percent and chlorine being present in an amount of 20 parts per million.

17. A process in accordance with claim 9 wherein the selenium alloy is comprised of selenium-arsenic with about 2 weight percent of arsenic.

18. A process in accordance with claim 9 wherein the selenium alloy is comprised of selenium-tellurium with from about 10 to about 15 weight percent of tellurium.

19. A process in accordance with claim 18 wherein the top surface tellurium concentration after vacuum deposition is from about 11 to about 12 weight percent.

20. A process in accordance with claim 18 wherein the top surface tellurium concentration after vacuum deposition is from about 17 to about 18 weight percent at 0.1 micron and 0.5 micron thickness of the alloy product.

21. A process for the preparation of chalcogenide alloys which comprises admixing with a chalcogenide alloy a metal oxide or a mixture of metal oxides in an amount from about 0.1 to about 15 percent by weight, whereby a crust or a layer comprised of a metal oxide or a mixture of metal oxides formed on the chalcogenide alloys; and subsequently subjecting the resulting mixture to evaporation thereby controlling fractionation of the alloy.

22. A process in accordance with claim 21 wherein the chalcogenide alloys resulting are deposited on a substrate.

23. A process for the preparation of selenium alloys which comprises the evaporation of a selenium alloy and a metal oxide in an amount from about 0.1 to about 15 percent by weight whereby a metal oxide crust or layer is formed on the selenium alloy prior to evaporation.

24. A process for controlling the fractionation of chalcogenide alloy compositions which comprises providing a chalcogenide alloy; admixing therewith a metal oxide in an amount from about 0.1 to about 15 percent by weight; whereby a metal oxide crust or layer is formed on the chalcogenide alloy thereby eliminating or minimizing the fractionation and subsequently subjecting the resulting mixture to evaporation.

25. A process for controlling the fractionation of a selenium alloy composition which comprises providing a selenium alloy; admixing therewith a metal oxide in an amount from about 0.1 to about 15 percent by weight whereby a metal oxide crust or layer is formed on the selenium alloy; and subsequently subjecting the resulting mixture to evaporation.

26. A process in accordance with claim 25 wherein the metal oxide is tellurium dioxide, bismuth oxide, tin oxide, or selenium oxide.

27. A process in accordance with claim 25 wherein the alloy is comprised of selenium and tellurium with from about 14 to about 15 percent by weight of tellurium.

28. A process for the preparation of chalcogenide alloys which comprises the evaporation of a chalcogenide alloy and a metal oxide in an amount from about 0.1 to about 15 percent by weight mixture whereby a metal oxide crust or layer is formed on the chalcogenide alloy prior to evaporation.

29. A process for controlling the fractionation of chalcogenide alloys which comprises providing a mixture of chalcogenide alloy and a metal oxide in an amount from about 0.1 to about 15 percent by weight whereby a metal oxide crust or layer is formed on the chalcogenide alloy, and subsequently subjecting the resulting mixture to evaporation.

30. A process for controlling fractionation of a chalcogenide alloy which comprises providing a chalcogenide alloy; admixing therewith a metal oxide in an amount from about 0.1 to about 15 percent by weight whereby a metal oxide crust or layer is formed on the chalcogenide alloy, and subsequently subjecting the resulting mixture to evaporation at a temperature of from about 250° to about 450° C.

31. A process for controlling the fractionation of a chalcogenide alloy which comprises the evaporation of a chalcogenide alloy and a metal oxide in an amount from about 0.1 to about 15 percent by weight whereby a metal oxide crust or layer is formed on the chalcogenide alloy prior to evaporation.

32. A process in accordance with claim 28 wherein the metal oxide is tellurium dioxide, bismuth oxide, tin oxide, or selenium oxide.

33. A process in accordance with claim 29 wherein the metal oxide is tellurium dioxide, bismuth oxide, tin oxide, or selenium oxide.

34. A process in accordance with claim 30 wherein the metal oxide is tellurium dioxide, bismuth oxide, tin oxide, or selenium oxide.

35. A process in accordance with claim 31 wherein the metal oxide is tellurium dioxide, bismuth oxide, tin oxide, or selenium oxide.

36. A process in accordance with claim 31 wherein evaporation is accomplished by heating at a temperature of from about 250° to 450° C.

37. A process in accordance with claim 1 wherein the alloy contains about 10 to about 40 percent by weight of tellurium.

38. A process in accordance with claim 35 wherein the top surface tellurium concentration after evaporation is from about 17 to about 18 percent by weight.

39. A process in accordance with claim 35 wherein the top surface tellurium is present in an amount of from about 16 to about 17 percent by weight in the resulting alloy product obtained.

40. A process in accordance with claim 35 wherein the top surface tellurium is present in an amount of from about 17 to about 18 percent by weight in the resulting alloy product obtained.

41. A process in accordance with claim 1 wherein the metal oxide is copper oxide, aluminum oxide, calcium oxide, barium oxide, antimony oxide, silicon oxide, titanium oxide, or arsenic oxide.

42. A process in accordance with claim 9 wherein the metal oxide is copper oxide, aluminum oxide, calcium oxide, barium oxide, antimony oxide, silicon oxide, titanium oxide, or arsenic oxide.

43. A process in accordance with claim 1 wherein evaporation is accomplished by heating at a temperature of from about 250° to about 450° C.

44. A process in accordance with claim 1 wherein the metal oxide is admixed in an amount of from about 0.1 to about 15 percent by weight.

45. A process in accordance with claim 9 wherein there results a selenium-arsenic, a selenium-tellurium, or a selenium tellurium arsenic alloy.

46. A process in accordance with claim 1 wherein there is formed on the surface of the alloy a crust comprised of metal oxides.

47. A process in accordance with claim 9 wherein there is formed on the surface of the selenium alloy a crust comprised of metal oxides.

48. A process for controlling the fractionation of chalcogenide alloys which comprises providing in a container a chalcogenide alloy; admixing therewith a metal oxide in an amount from about 0.1 to about 15 percent by weight whereby a metal oxide crust or layer is formed on the chalcogenide alloy; and subsequently subjecting the resulting mixture to evaporation.

49. A process in accordance with claim 48 wherein, prior to evaporation and cooling, there results a chalcogenide alloy with a metal oxide layer on the surface thereof permitting reduced fractionation of said alloy.

50. A process in accordance with claim 9 whereby there is formed on the selenium alloy a blanket of the metal oxide.

51. A process for the preparation of chalogenide alloy compositions which comprises providing a chalcogenide alloy, sprinkling on the surface of the alloy a metal oxide in an amount from about 0.1 to about 15 percent by weight, and subsequently subjecting the resulting mixture to evaporation and wherein a metal oxide crust is formed on the chalcogenide alloy prior to evaporation.

52. A process in accordance with claim 51 wherein the crust is formed by sprinkling the metal oxide on the alloy surface prior to evaporation.

* * * * *